(12) United States Patent
Tomimbang

(10) Patent No.: US 7,697,248 B2
(45) Date of Patent: Apr. 13, 2010

(54) ELECTRICAL ARC FAULT CIRCUIT INTERRUPTER APPARATUS AND METHOD

(76) Inventor: Wendell E. Tomimbang, 108 Burnside Way, Kissimmee, FL (US) 34744

( * ) Notice: Subject to any disclaimer, the term of this patent is extended or adjusted under 35 U.S.C. 154(b) by 0 days.

(21) Appl. No.: 11/956,364

(22) Filed: Dec. 14, 2007

(65) Prior Publication Data
US 2009/0154033 A1 Jun. 18, 2009

(51) Int. Cl.
*H02H 3/00* (2006.01)
(52) U.S. Cl. .................................................. 361/42
(58) Field of Classification Search ............... 361/93.1, 361/42; 324/509, 536
See application file for complete search history.

(56) References Cited
U.S. PATENT DOCUMENTS

| | | | | |
|---|---|---|---|---|
| 6,128,169 A | * | 10/2000 | Neiger et al. ................. | 361/42 |
| 6,417,671 B1 | * | 7/2002 | Tiemann ...................... | 324/509 |
| 6,577,138 B2 | * | 6/2003 | Zuercher et al. ............. | 324/536 |
| 7,254,004 B2 | * | 8/2007 | Mladenik et al. ............ | 361/93.1 |
| 7,295,410 B1 | * | 11/2007 | Packard et al. ............... | 361/42 |

* cited by examiner

*Primary Examiner*—Jared J Fureman
*Assistant Examiner*—Angela Brooks
(74) *Attorney, Agent, or Firm*—The Miller Law Offices, PLC

(57) ABSTRACT

In all electrical circuits, various arcing conditions can arise, however, there are primary ones are series arcing (low current arcing), and, parallel arcing (high current arcing). An arc fault circuit interrupter ("AFCI") that protects for both series and parallel arcing is called a combination type. An AFCI is a device that controls the effects of electrical arcing by opening a circuit through a tripping mechanism that isolates the load from the supply line upon detection of an arcing condition. In this invention, this arc fault is detected by a Hall-Effect sensor ("HES"), a HES integrated circuit, and microprocessor. When circuit fluctuation starts, the microprocessor logs this from its first occurrence then compares it to a pre-determined threshold time to determine an arcing condition. Continued fluctuation beyond this threshold time is considered an arcing condition for safety the microprocessor then executes a command to activate the tripping mechanism.

16 Claims, 2 Drawing Sheets

ELECTRICAL ARC FAULT CIRCUIT INTERRUPTER APPARATUS AND METHOD

CROSS REFERENCE TO RELATED APPLICATIONS

Not Applicable.

STATEMENT REGARDING FEDERALLY SPONSORED RESEARCH OR DEVELOPMENT

Not Applicable

DESCRIPTION OF ATTACHED APPENDIX

Not Applicable

BACKGROUND OF THE INVENTION

Field of the Invention

The present invention relates to the protection of electrical circuits and to the detection of electrical arcing faults and in addition, optional overload fault detection.

An arc fault circuit interrupter ("AFCI") is a device that controls the effects of electrical arcing by opening a circuit through a tripping mechanism that isolates the load from the supply line upon detection of an arcing condition. Arcing is a phenomenon wherein a part of a circuit, i.e., line, neutral or ground wire causes a transient or intermittent conductive path other than between the conducting lines between line and load. This intermittent conduction of current may be a result of a carbonized path between conductors, a wire cut in a conductor which does not have complete isolation between the sections, deteriorated insulation of conductors, nicked wires caused unintentionally or unknowingly by nails and the like driven through concealed wires in a wall, or other similar situations. With the intermittent flow of current or as called arcing, heat is built up until it reaches an energy level high enough to cause or facilitate ignition of the surrounding materials which in turn builds up into fire. Arcing is considered to be one of the main causes of electrically-generated fires. It is in two forms, parallel and series arcing. Parallel arcing is high current as this occurs between 2 conductors, whereas series arcing has lower current values since it is within a conductor itself.

The National Electrical Code ("NEC") mandated the use of AFCI's for different applications such as Receptacle, and Portable types and are covered by American National Standards Institute/Underwriters Laboratories ("ANSI/UL") standard UL 1699. This standard has stipulated the various requirements for tests and qualification of the different types of AFCIs.

When used for circuit breakers, this AFCI circuitry eliminates the use of the prior art's traditional bimetallic contacts which reacted to high current to isolate the load from the line. Traditional circuit breakers or other devices do not have indication for which fault occurred that caused the tripping action. Traditional receptacles or other devices are used for one specific limited voltage rating i.e., 115V, or 220V, whereas this invention covers a wide range and can be adapted to any level with specified range using power switchers. Other AFCI's in the prior art do not have end-of-life feature. Other AFCI's are designed for single fixed voltage rating and not a wide voltage range as this invention. Other AFCI's or wiring devices are not provided with overload features and indications. Other AFCI's are made to specific use, i.e. circuit breakers or receptacles, unlike this invention which is applicable to single phase circuits, multi-phase circuits, circuit breaker, receptacle, outlets, cords, power strips, equipment controllers and other wiring devices with switchable contacts. Automatic power switchers have not been used in AFCI applications in the prior art. Known AFCIs did not have the combined protection of arcing and overload conditions, with this method of detection.

In the recent prior art, specifically U.S. Pat. No. 7,253,637, (hereinafter the "Dvorak Patent"), said Patent addressed the problem of detecting an arc fault in a branch feeder circuit by addressing a need in the art for a combination type AFCI. The Dvorak patent approached solving that problem by detecting the presence of high frequency current components at low level amperage series arcing currents, said high frequency components being superimposed upon and within the 60 HZ frequency of the supply power from the utility.

The Dvorak patent's circuit operates by monitoring the particular circuit's voltage disturbance high frequencies and variations thereof superimposed upon the 60 HZ frequency of the utilities supply power, by comprising a filter circuit for analyzing its sensor signal to determine the presence of noise in a predetermined frequency range, and producing a corresponding filtered signal. It also has a comparator circuit comparing the corresponding filtered signal to a reference threshold voltage to generate an output signal. It has a switching circuit to receive a plurality of threshold voltages and it operates to select one of those threshold voltages as the reference threshold voltage for application to the comparator circuit. Dvorak's patent primary sensor is a "di/dt" sensor, to detect the various circuit disturbance frequencies, and anomalies therein, then uses certain filters to attempt to clean up said signals, run said filtered signals through a chip based algorithm, and compare against a reference threshold voltage. The problem with the Dvorak patent is the use of a "di/dt" sensor at its core, and the inherent inaccuracies related thereto. To solve this problem with the "di/dt" sensors in the prior art (Dvorak patent), the applicant's current invention presented herein uses a Hall Effect Sensor in the branch circuit, said Hall Effect Sensor not using "di/dt" sensing or frequency variations for its operation, and therefore has none of the problems associated with frequency measurement (i.e. noise, filtering, etc.), thereby avoiding and solving this problem. In the instant invention herein, the detection circuitry relies on a Hall-Effect Sensor which continuously monitors the current flowing on the circuit. Every current value passing through this sensor has an equivalent magnetic flux which in turn is converted into a voltage. This value remain steady as a reference voltage and only fluctuates when an arcing condition occurs. The voltage is monitored against time pre-set in the microprocessor. When the condition is validated as a fault, the microprocessor activates the tripping mechanism to open the circuit.

BRIEF SUMMARY OF THE INVENTION

In all electrical circuits, various arcing conditions can arise, however, there are mainly two: Series arcing (or low current arcing), and, parallel arcing (or high current arcing). An AFCI that protects for both series and parallel arcing is called a combination type.

The detection circuitry is actually a monitor for the real-time condition of an electric circuit and serves as the main controller of the AFCI device. In this invention, load conditions in the form of output voltages are derived from a Hall-Effect sensor ("HES") which serves as the main detection method used in this invention. An HES integrated circuit is connected with the supply side of the AFCI and continuously monitors the circuit conditions. When an electrical load is connected to the circuit, an equivalent output is derived from the HES integrated circuitry, and at normal conditions, this remain steady at "0" value or a certain equivalent voltage value considered as a reference point. This value serves to the microprocessor as a normal condition reference point. This reference point remains at steady state regardless of the value of current drawn by the load provided there are no abnormal conditions like arcing in the line. This is attained by the dynamic offset cancellation of the HES integrated circuitry. When an arcing condition occurs, the output voltage deviates or fluctuates from the reference point and this condition is monitored by the microprocessor. When voltage fluctuation starts, the microprocessor logs in the time from its first occurrence to a pre-determined threshold time to determine an arcing condition. Continued fluctuation beyond this threshold time is considered an arcing condition and it is no longer safe for the device to continue operation. The microprocessor also monitors the voltage values at any given time. The microprocessor has pre-set values of voltages corresponding to line currents that define minimum arcing conditions, as for example: for an arcing condition with X Amps, there is a corresponding Y voltage value. When both the threshold time and the magnitude of the voltage which corresponds to the pre-set minimum values to define arcing conditions are reached, the microprocessor then executes a command to activate the tripping mechanism.

With the HES and using the same circuitry, overload protection can also be provided, and this invention optionally includes this in an alternate embodiment. When an overload condition occurs, a corresponding output voltage is obtained from the HES. As this is only an overload condition with steady output voltage without fluctuations in value, it is not detected as an arcing condition. Instead, the corresponding increase in output voltage which is proportional to a current flow on the HES, will be compared to a pre-set value in the microprocessor. This pre-set value is equivalent to the maximum rated load of the device and any value above it is classified by the microprocessor as an overload condition. A pre-set time is programmed in the microprocessor to validate the condition as an overload. Once validated, the microprocessor activates the tripping circuitry and mechanism.

The above process of voltage output and time measurement eliminates the chances of nuisance tripping conditions which may come as a result of single or multiple loads being connected at a time or at the same time, and/or transients resulting from different load characteristics at different stages of operation.

The detection circuitry relies on a Hall-Effect Sensor which continuously monitors the current flowing on the circuit. Every current value passing through this sensor has an equivalent magnetic flux which in turn is converted into a voltage. This value remain steady as a reference voltage and only fluctuates when an arcing condition occurs. The voltage is monitored against time pre-set in the microprocessor. When the condition is validated as a fault, the microprocessor activates the tripping mechanism to open the circuit. The device remains open until the manual re-set button is activated provided the fault condition is corrected.

BRIEF DESCRIPTION OF THE DRAWINGS

The drawings constitute a part of this specification and include exemplary embodiments to the invention, which may be embodied in various forms. It is to be understood that in some instances various aspects of the invention may be shown exaggerated or enlarged to facilitate an understanding of the invention.

In the drawings.

DETAILED DESCRIPTION OF THE EMBODIMENTS

Detailed descriptions of the preferred embodiment are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

Figure 1:
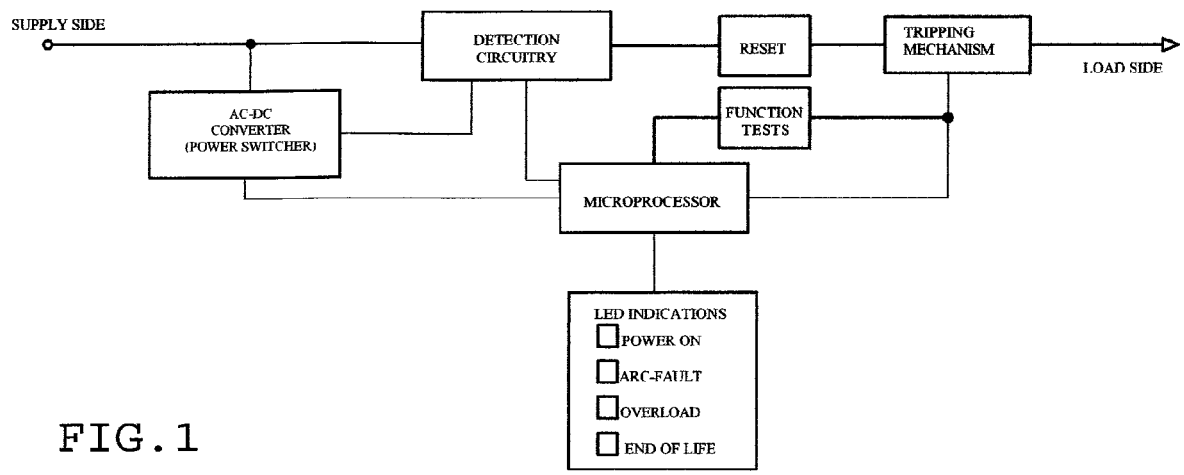
FIG. 1 is a functional block diagram of the arc fault circuit interrupter apparatus in accordance with the invention.
Figure 2:
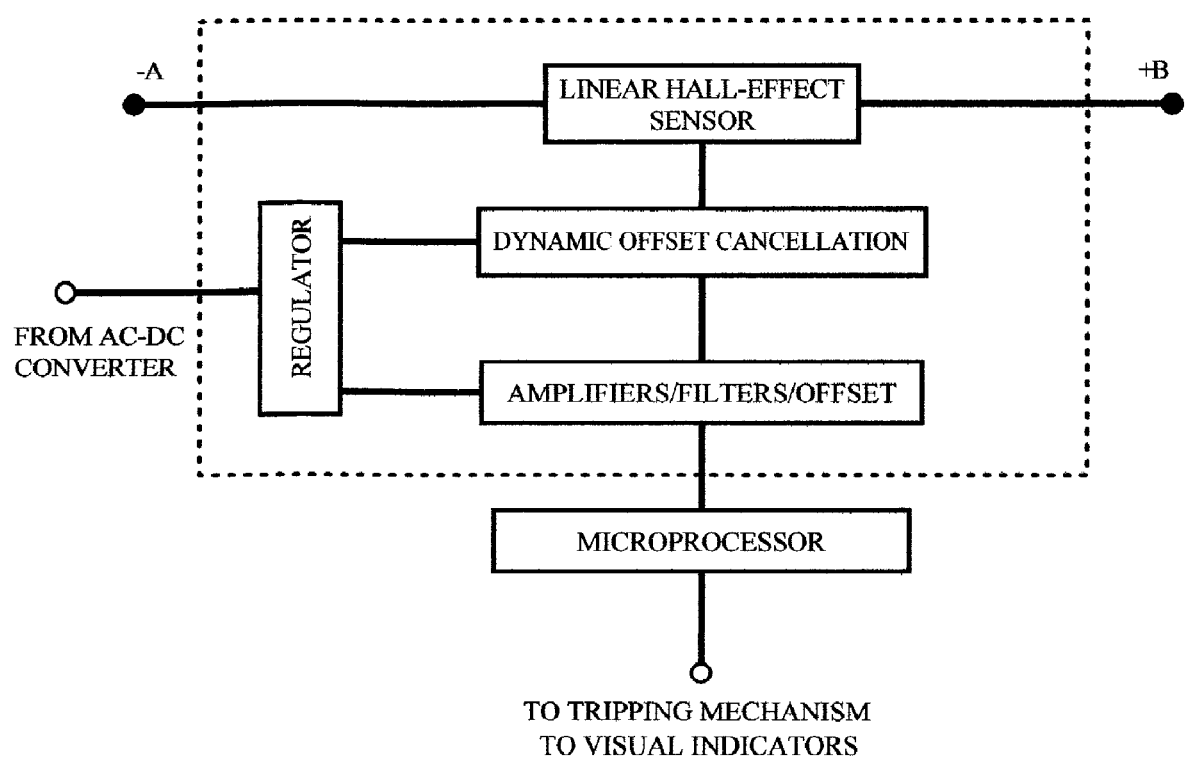
FIG. 2 is a functional block diagram showing further details of the Detection Circuitry of FIG. 1.

FIG. 1 is a functional block diagram of one embodiment of the arc fault circuit interrupter apparatus in accordance with the invention and FIG. 2 is a functional block diagram showing further details of the Detection Circuitry of FIG. 1. The arc fault sensing technique is attained by the use of a Hall Effect Sensor ("HES"). This device has an HES circuit with low-offset using conductive copper path. The circuit current flowing through this conductive path generates a magnetic field that is sensed by the HES integrated circuitry and converted into a proportional voltage. With uniform proportional voltage corresponding to the circuit current, the output voltage remains zero or a certain reference voltage which is independent of the actual load current at any given time. This is regularly monitored by the microprocessor as an ideal no-fault or normal condition. Arcing is distinguished by the fluctuation in the HES output voltage. The fluctuation in the HES output voltage when continuous beyond the pre-set threshold time confirms an arcing condition exists. The microprocessor is programmed with a pre-set time considered as a threshold time beyond which, the condition is determined as arcing condition, Immediately beyond the threshold time, the microprocessor confirms that there is arcing condition and no longer safe to allow this condition to continue. At that point, the microprocessor executes commands to activate the tripping circuit and tripping mechanism. When the voltage fluctuation continuous beyond the pre-set threshold time, the microprocessor sends signal to the tripping mechanism to isolate the circuit. The microprocessor is programmed to sense the fluctuation of this output voltage and validate the condition over a specified time. This is to avoid the effects of nuisance tripping as well as patterns represented by different load conditions as: starting of motor-operated loads, dimmer switch-controlled loads, and other loads whether single or combined, with high or irregular starting currents. By using the above-mentioned technique of arc detection, nuisance tripping with single load is eliminated. This is made possible by the detection circuitry validating the output voltage fluctuation representative of an arcing condition, and the continuity of the condition over a pre-set threshold time which is beyond the time any load stabilizes from start-up conditions. By using the above-mentioned technique of arc detection, nuisance tripping with multiple loads is eliminated. This is made possible by the detection circuitry validating the output voltage fluctuation representative of an arcing condition, and the continuity of the condition over a pre-set threshold time which is beyond the time any load stabilizes from start-up conditions. By using the above-mentioned technique of arc detection, the effects of the varying starting characteristics of various loads and/or combination of these loads is eliminated. This is made possible by the detection circuitry validating the output voltage fluctuation representative of an arcing condition, and the continuity of the condition over a pre-set threshold time which is beyond the time any load stabilizes from start-up conditions. By using the above-mentioned technique of arc detection, the effects of the varying starting, running and shut-down characteristics of various loads and/or combination of these loads is eliminated. This is made possible by the detection circuitry validating the output voltage fluctuation representative of an arcing condition, and the continuity of the condition over a pre-set threshold time which is beyond the time any load stabilizes from start-up conditions. By using the above-mentioned technique of arc detection, multiple loads becomes one distinct load with one output voltage. By using the above-mentioned technique of arc detection, starting characteristics of different loads do not affect the normal condition status of the circuit and therefore eliminates the most potential source of nuisance tripping. This AFCI design and method of detection used also monitors and detects upstream and downstream arcing conditions; however, protection is only afforded to the downstream loads. This AFCI design optionally provides circuit overload protection in an alternate embodiment. This is attained by the measurement of the actual load current. The microprocessor is programmed with a current limit setting beyond predetermined tolerable overload condition and period. Once this is exceeded representative of an overload condition, the tripping circuit receives command from the microprocessor to activate the tripping mechanism without any further pre-conditions or validations. This AFCI is equipped with a secured mechanical manual re-set button such that the contacts remain open until it is released. This AFCI design is adaptable to any low voltage rating up to 600V. An alternate embodiment would include higher voltages using the same principle. This AFCI optionally includes a visual indication system that includes: arc fault, overload, Power On and end-of-life indicators. This AFCI is applicable to single phase circuits, multi-phase circuits, circuit breakers, receptacles, outlets, cords, power strips, equipment controllers and other wiring devices with switchable contacts. This AFCI is optionally provided with End-Of-Life feature and pre-programmed periodic testing to insure healthy system condition. The end-of-life feature ensures that mechanical and electronic systems are still healthy at any given time to afford the protection the device is designed to perform. This AFCI is equipped with Test button which activates an automatic operating system through the microprocessor to sequentially check for arc fault and overload fault protection. This invention optionally provides mis-wire feature and protection for the device. This device is a combination type providing low-current (series) and high-current (parallel) arcing protection in one system. An optional HES overload protection is also provided by this invention. When an overload condition occurs, a corresponding output voltage is obtained from the HES. As this is only an overload condition with steady output voltage without fluctuations in value, it is not detected as an arcing condition. Instead, the corresponding increase in output voltage which is proportional to a current flow on the HES, will be compared to a pre-set value in the microprocessor. This pre-set value is equivalent to the maximum rated load of the device and any value above it is classified by the microprocessor as an overload condition. A pre-set time is programmed in the microprocessor to validate the condition as an overload. This pre-set time allows for transients or high currents associated with different starting and shut-down characteristics of various electrical loads to reach steady state, thereby eliminating a potential source of nuisance or unwanted tripping. Once validated, the microprocessor activates the tripping circuitry and mechanism. This design eliminates the use of bimetallic contacts in the prior art, by using actual current measurements to provide short circuit protection as normally used in traditional circuit breakers. This design uses integrated power switchers as power source to become applicable to the wide voltage range applications in one time rather than fixed.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. A combination type arc fault circuit interrupter apparatus comprising:
   a direct current power supply to provide power to all elements of the apparatus, detection circuitry comprising a Hall Effect Sensor, said Hall Effect Sensor being a Linear Hall Effect Sensor Integrated Circuit with dynamic offset cancellation where current flows through a copper conductive path that generates a magnetic field which is sensed by the Hall Effect Sensor integrated circuitry and converted into a proportional output voltage, said voltage remaining steady as reference and fluctuates when arcing condition occurs, said condition monitored against time pre-set in the microprocessor, and when such condition is validated as a fault, said microprocessor activating a tripping mechanism to open said load circuit.

2. The circuit of claim 1 wherein said direct current power supply comprises an AC to DC Converter Power Switcher, said converter being an Automatic Power Switcher which can operate in a range of input AC voltages from 80 volts to 600 volts, and produce a constant output DC voltage.

3. The circuit of claim 1 further comprising an end-of-life element wherein said element includes pre-programmed periodic testing to insure that mechanical and electronic systems are still functioning properly at any given time to afford the protection said apparatus is designed to perform.

4. The circuit of claim 1 further comprising overload current detection and related circuit tripping mechanism actuation.

5. The circuit of claim 1 further comprising circuit function testing elements comprising a manual Test button which activates an automatic operating system through the microprocessor to sequentially check for arc fault and overload fault protection.

6. The circuit of claim 1 further comprising a mis-wire element to protect said apparatus when installing.

7. The circuit of claim 1 further comprising visual display indicators for circuit power availability, arc-fault, overload and end-of-life.

8. The circuit of claim 1 wherein the reset element is comprised of a manual push button.

9. A method for detecting and interrupting an electrical circuit due to an arc fault comprising:
   Using a combination type arc fault circuit interrupter powered by a direct current power supply to provide power to all elements of the apparatus, using detection circuitry comprising a Hall Effect Sensor, said Hall Effect Sensor being a Linear Hall Effect Sensor Integrated Circuit with dynamic offset cancellation where current flows through a copper conductive path that generates a magnetic field which is sensed by the Hall Effect Sensor integrated circuitry and converted into a proportional output voltage, said voltage remaining steady as reference and fluctuates when arcing condition occurs, said condition monitored against time pre-set in the microprocessor, and when such condition is validated as a fault, said microprocessor activating a tripping mechanism to open said load circuit.

10. The method of claim 9 wherein said direct current supply comprises a AC to DC Converter Power Switcher, said converter being an Automatic Power Switcher which can operate in a range of input AC voltages from 80 volts to 600 volts, and produce a constant output DC voltage.

11. The method of claim 9 further comprising an end-of-life element wherein said element includes pre-programmed periodic testing to insure that mechanical and electronic systems are still functioning properly at any given time to afford the protection said apparatus is designed to perform.

12. The method of claim 9 further comprising overload current detection and related circuit tripping mechanism actuation.

13. The method of claim 9 further comprising circuit function testing elements comprising a manual Test button which activates an automatic operating system through the microprocessor to sequentially check for arc fault and overload fault protection.

14. The method of claim 9 further comprising a mis-wire element to protect said apparatus when installing.

15. The method of claim 9 further comprising visual display indicators for circuit power availability, arc-fault, overload and end-of-life.

16. The method of claim 9 wherein the reset element is comprised of a manual push button.

* * * * *